(12) United States Patent
Kaneko

(10) Patent No.: US 8,415,740 B2
(45) Date of Patent: Apr. 9, 2013

(54) SEMICONDUCTOR DEVICE

(75) Inventor: Atsushi Kaneko, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/358,526

(22) Filed: Jan. 26, 2012

(65) Prior Publication Data

US 2012/0126316 A1    May 24, 2012

Related U.S. Application Data

(62) Division of application No. 12/621,711, filed on Nov. 19, 2009, now Pat. No. 8,133,785.

(30) Foreign Application Priority Data

Nov. 20, 2008    (JP) .................................. 2008-297030

(51) Int. Cl.
*H01L 29/66*    (2006.01)
*H01L 29/78*    (2006.01)

(52) U.S. Cl. ........ 257/330; 257/331; 257/332; 257/328; 257/329

(58) Field of Classification Search .................. 257/330, 257/331, 342, 328, 333, 334, 329, 302, 341, 257/401, 491, 492, 332
See application file for complete search history.

(56) References Cited

U.S. PATENT DOCUMENTS

| 5,753,556 | A   |   | 5/1998  | Katada et al. |         |
|-----------|-----|---|---------|---------------|---------|
| 6,316,806 | B1  | * | 11/2001 | Mo            | 257/330 |
| 6,583,010 | B2  |   | 6/2003  | Mo            |         |
| 6,916,712 | B2  |   | 7/2005  | Kocon et al.  |         |
| 7,652,326 | B2  | * | 1/2010  | Kocon         | 257/328 |

FOREIGN PATENT DOCUMENTS

JP    2008-112936    5/2008

* cited by examiner

*Primary Examiner* — Chuong A. Luu
(74) *Attorney, Agent, or Firm* — Young & Thompson

(57) ABSTRACT

Provided is a method of manufacturing a semiconductor device, that buried gate electrodes are formed in a pair of trenches in a substrate, so as to be recessed from the level of the top end of the trenches, a base region is formed between a predetermined region located between the pair of trenches, and a source region is formed over the base region.

7 Claims, 8 Drawing Sheets

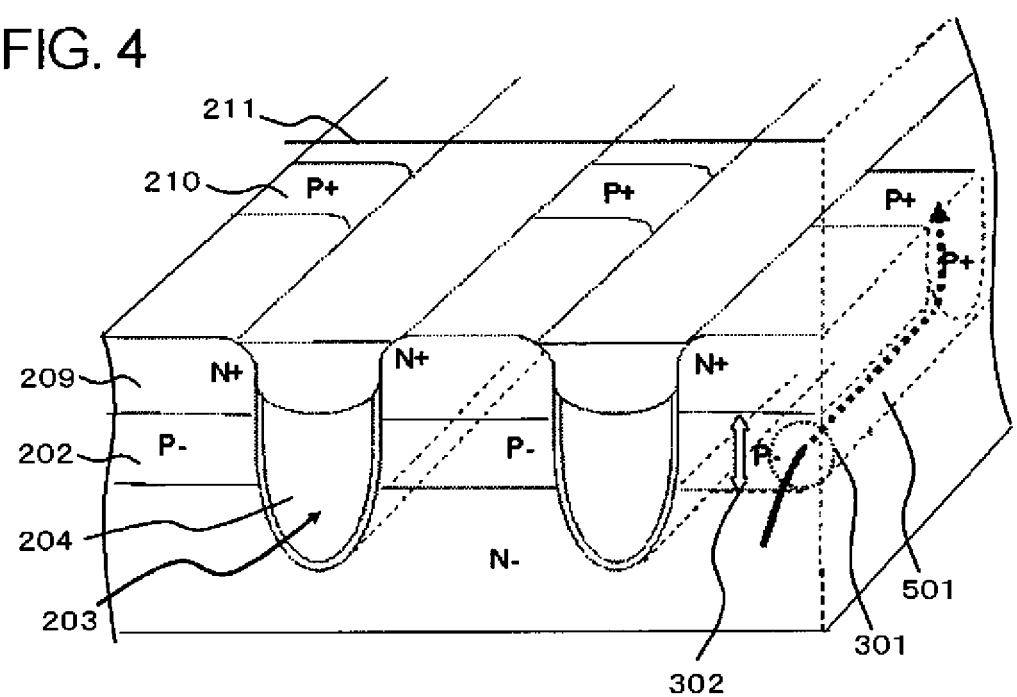

SEMICONDUCTOR DEVICE

This application is a division of application Ser. No. 12/621,711 filed on Nov. 19, 2009 now U.S. Pat. No. 8,133,785, which claims foreign priority to Japanese patent application 2008-297030 filed Nov. 20, 2008. The entire content of each of these applications is hereby expressly incorporated by reference.

BACKGROUND

1. Technical Field

The present invention relates to a semiconductor device and a method of manufacturing the same.

2. Related Art

Aiming at reducing the ON resistance of trench-gate-type MOSFET structures by narrowing the cell distance, a large-scale shrinkage of the cell may be achieved by filling stripe-patterned gate trenches with an insulating interlayer, after removing by over-etching a part of gate polysilicon layer preliminarily filling up the gate trenches, and by arranging a stack of an $N^+$-source layer and a $P^+$-base layer alternately with the gate trenches.

The U.S. Pat. No. 6,916,712 describes a MOSFET based on a structure having buried insulating interlayers in trenches. A process of manufacturing the conventional MOSFET having the buried insulating interlayers in the trenches will be explained referring to FIGS. 2A to 2C, and FIGS. 3A to 3D.

First, before the trenches are formed, a P-base layer 202 is formed in a substrate by ion implantation 201 effected in the direction of normal line (FIG. 2A). Next, trenches 203 are formed, and a gate oxide film 204 and a polysilicon layer 205 are formed over the trenches 203 (FIGS. 2B, 2C). The entire surface of the polysilicon layer 205 is then etched back, to thereby leave polysilicon layers 205 which serve later as buried gate electrodes in the trenches (FIG. 3A). Buried insulating interlayers 206 are then formed in the trenches 203 (FIG. 3B).

Regions of the P-base layers 202 reserved for later formation of a back gate layer are masked with a photoresist 207, and $N^+$-source layers 209 are formed over the P-base layers 202 by ion implantation 208 (FIG. 3C). $P^+$-back gate layers 210 and a source electrode 211 are then formed (FIG. 3D).

In the above MOSFET having the buried insulating interlayers in the gate trenches, the polysilicon layer 205 is etched back so as to allow filling-up of the trenches 203 with the buried insulating interlayer 206. In this process, it has been necessary to form the $N^+$-source layers 209 deeply enough, so as not to cause offset, which means that the bottom lines of $N^+$-source layers 209 are unsuccessful to reach the level of the upper end of the polysilicon layers 205 which serve as the buried gate electrodes.

The present inventors study an avalanche operation of the above MOSFET showed, to find the following problem. This problem in the avalanche operation will be explained, referring to FIG. 4.

Since the P-base layers 202 and the $N^+$-source layers 209 are formed as described in the above, the thickness of each of these layers is almost constant. Also since the $N^+$-source layers 209 are formed deeply enough, so as not to cause offset with respect to the polysilicon layers 205 remained after the etch-back, so that the P-base layers 202 are formed shallow and flat.

Accordingly, due to a small thickness 302 of the P-base layers, there has been known a problem in that the base resistance along a current path 301 towards the $P^+$-back gate layers 210 increases, and the Avalanche resistance degrades as a consequence.

In the MOSFET under the Avalanche operation, the base resistance along the current path largely affects the breakdown voltage. It is generally considered that shallower $N^+$-source layers and deeper P-base layers may be advantageous to moderate the resistance along the path of Avalanche current, and to improve the Avalanche resistance.

In view of avoiding the above-described offset and of moderating the ON resistance, the $N^+$-source layers are necessarily deepened. This may, however, make the P-base layers relatively shallower, so that the base resistance towards the $P^+$-back gate layer may increase, and thereby the Avalanche resistance may degrade. On the other hand, an attempt of making the $N^+$-source layers shallower, aimed at improving the Avalanche resistance, may not only make the $N^+$-source layer and the gate polysilicon layer more likely to cause the offset therebetween, but also increase the ON resistance.

In short, the conventional structure has been suffering form a trade-off problem between that reduction in the ON resistance and improvement in the Avalanche resistance.

At present, there have been known a variety of proposals on the above-described, stripe-patterned, gate trench MOSFETs (see Japanese Laid-Open Patent Publication No. 2008-112936, for example).

The MOSFET having the buried insulating interlayers in the trenches described in the U.S. Pat. No. 6,916,712 has been suffering from a problem in that the Avalanche resistance degrades if the $N^+$-source layers are made deeper, aiming at reducing the ON resistance. On the other hand, the ON resistance increases if the $N^+$-source layers are made shallower, aiming at improving the Avalanche resistance.

SUMMARY

According to the present invention, there is provided a method of manufacturing a semiconductor device which comprises buried gate electrodes formed in a pair of trenches in a substrate, a base region formed in a predetermined region of the substrate located between the pair of trenches, and a source region formed over the base region, the method includes:

a first step forming the pair of trenches in a stripe pattern in the substrate, and forming a polysilicon layer over the entire surface so as to fill the trenches;

a second step etching back the entire surface of the polysilicon layer so far as to remove the upper portions thereof buried in the trenches, to thereby form exposed portions of the substrate at the side walls of the trenches and at the top surface of the predetermined region, while leaving the residual polysilicon layers which later serve as the buried gate electrodes;

a third step obliquely implanting a first impurity through the exposed portions into the predetermined region, by rotational implantation which allows implantation in an oblique direction inclined away from the normal line which stands on the substrate, and then heating the predetermined region having the first impurity implanted therein so as to allow the first impurity to diffuse downward, to thereby form the base region; and a fourth step obliquely implanting a second impurity through the exposed portions into the predetermined region, by rotational implantation, to thereby form the source region over the base region.

According to the present invention, there is provided also a semiconductor device having buried gate electrodes formed in a pair of trenches formed in a substrate, the semiconductor device includes:

a base region formed in a predetermined region of the substrate located between the stripe-patterned pair of trenches;

a source region formed over the base region;

a first region having a first PN junction plane between the base region and the source region, in a channel region in the predetermined region located between the pair of trenches, and a second PN junction plane between the base region and the source region, formed shallower than the first PN junction plane, in a non-channel region; and a second region base region formed in the predetermined region, wherein the first region and the second region are alternately arranged in the longitudinal direction of the pair of trenches.

Since the source region is formed over the base region by obliquely implanting the second impurity through the exposed portion into the predetermined region between the stripe-patterned pair of trenches, so that the base layer may be formed shallower and the source layer may be formed deeper in the channel region, meanwhile the base layer may be formed deeper and the source layer may be formed shallower out of the channel region.

According to the present invention, the ON resistance may be reduced, and the Avalanche resistance may be improved at the same time.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a drawing illustrating Avalanche operation in the MOSFET of the related art having buried insulating interlayers in gate trenches;

DETAILED DESCRIPTION

Figure 1:
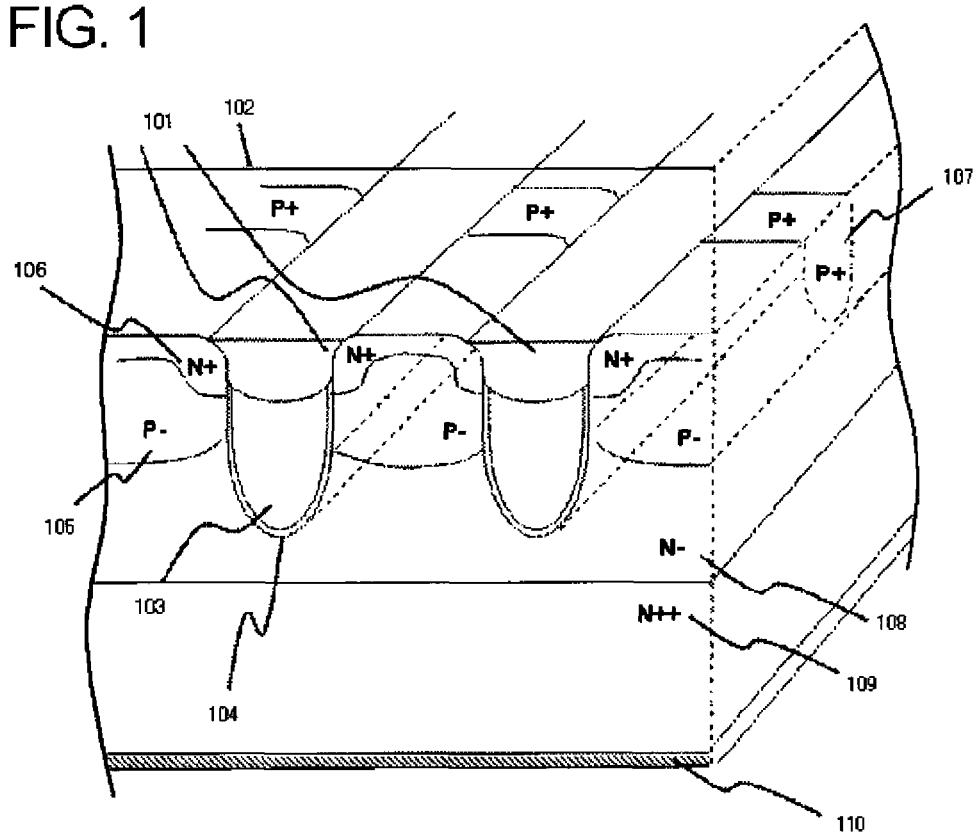
FIG. 1 is a sectional view of a MOSFET having buried insulating interlayers in gate trenches, according to an embodiment of the present invention.
Figure 2A:
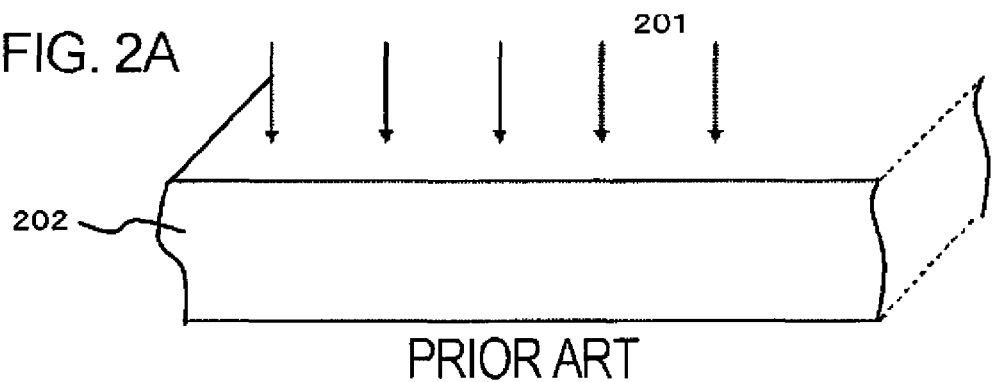
FIGS. 2A to 2C, and FIGS. 3A to 3D are sectional views schematically illustrating a manufacturing process of the MOSFET of the related art having buried insulating interlayers in gate trenches.
Figure 2B:
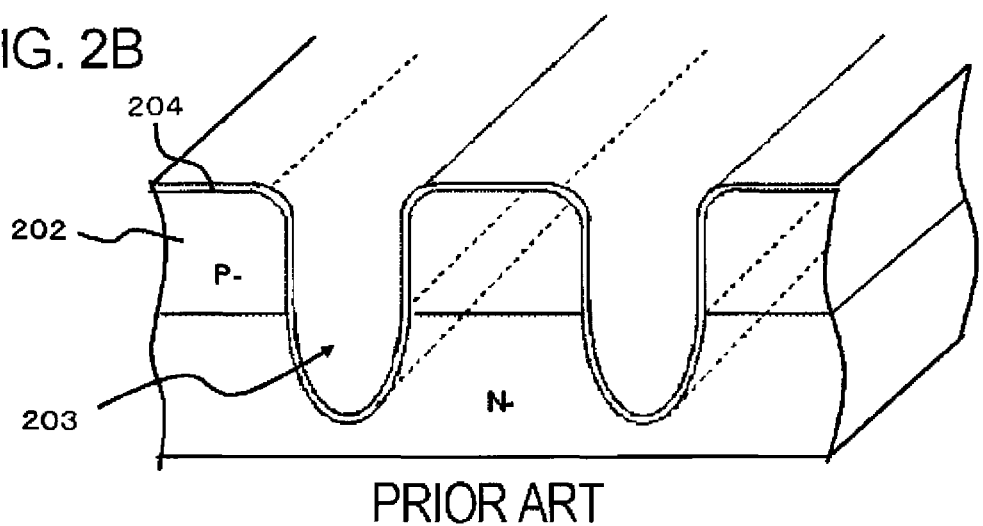
Figure 2C:
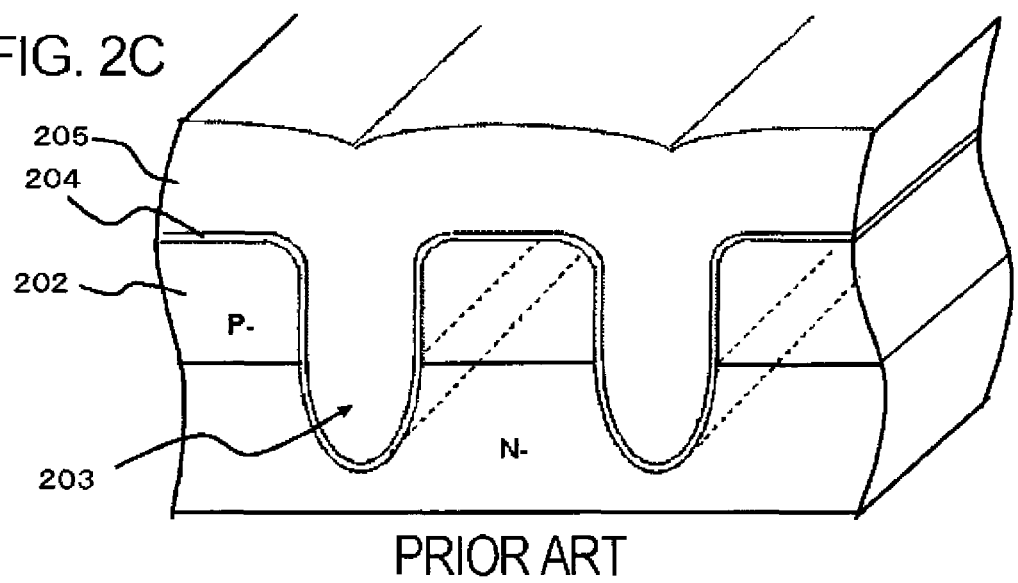
Figure 3A:
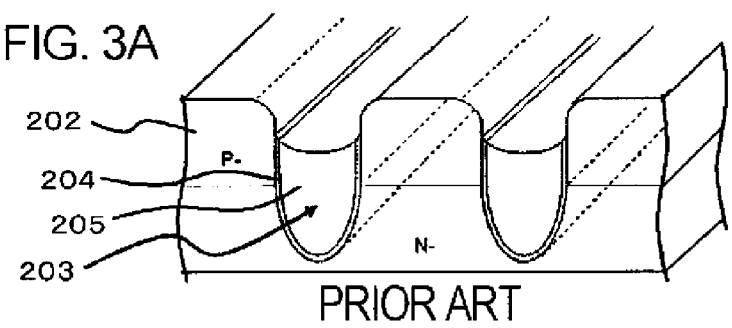
Figure 3B:
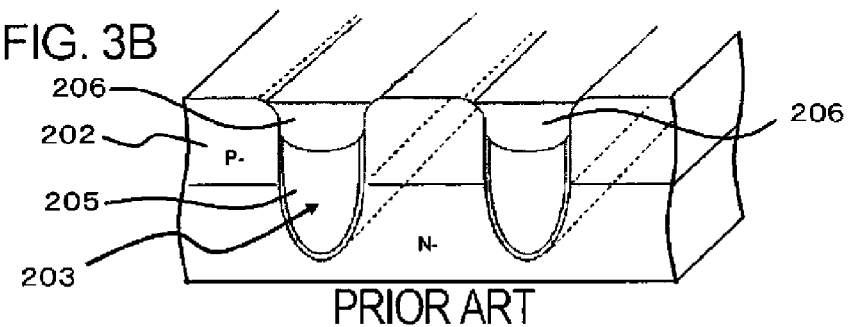
Figure 3C:
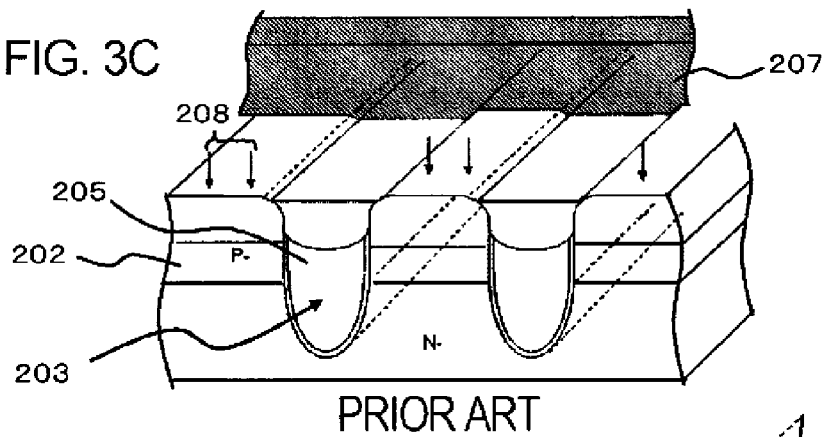
Figure 3D:
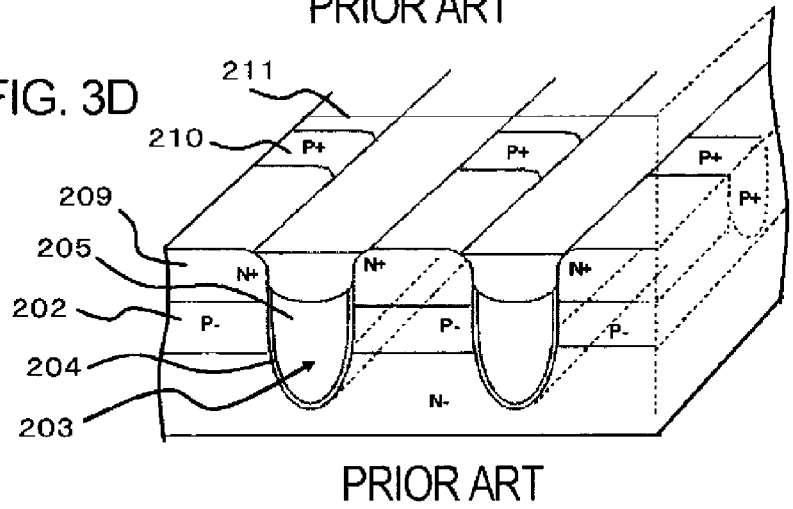

The invention will now be described herein with reference to illustrative embodiments. Those skilled in the art will recognize that many alternative embodiments can be accomplished using the teachings of the present invention and that the invention is not limited to the embodiments illustrated for explanatory purposes.

An embodiment of the present invention will be explained below referring to the attached drawings. Note that any constituents in this embodiment will conform to the same nomenclature, so as to avoid repetitive explanation.

The explanation in this embodiment will be given while prescribing the vertical and lateral directions as illustrated in the drawings. Note that the prescription only prescribes relative relationships among the constituents for convenience of explanation, without limiting posture of products which embody the present invention, in the process of manufacturing or use.

The method of manufacturing a semiconductor device of this embodiment is to form buried gate electrodes in a pair of trenches in a substrate, to form a base region in a predetermined region of the substrate located between the pair of trenches, and to form a source region over the base region.

The method of manufacturing includes the steps below:

(i) a first step forming the stripe-patterned pair of trenches in the substrate, and forming a polysilicon layer over the entire surface so as to fill the trenches;

(ii) a second step etching back the entire surface of the polysilicon layer so far as to remove the upper portions thereof in the trenches, to thereby form exposed portions of the substrate at the side walls of the trenches and at the top surface of the predetermined region, while leaving the residual polysilicon layers which later serve as the buried gate electrodes;

(iii) a third step obliquely implanting a first impurity through the exposed portions into the predetermined region, by rotational implantation which allows implantation in an oblique direction inclined away from the normal line which stands on the substrate, and then heating the predetermined region having the first impurity implanted therein so as to allow the first impurity to diffuse downward, to thereby form the base region; and (iiii) a fourth step obliquely implanting a second impurity through the exposed portions into the predetermined region, by rotational implantation, to thereby form the source region over the base region.

The individual steps will be explained, referring to the sectional views (FIGS. 5A to 5C, and FIGS. 6A to 6C) illustrating steps of manufacturing according to an embodiment of the present invention.

[(i) First Step]

Figure 5A:
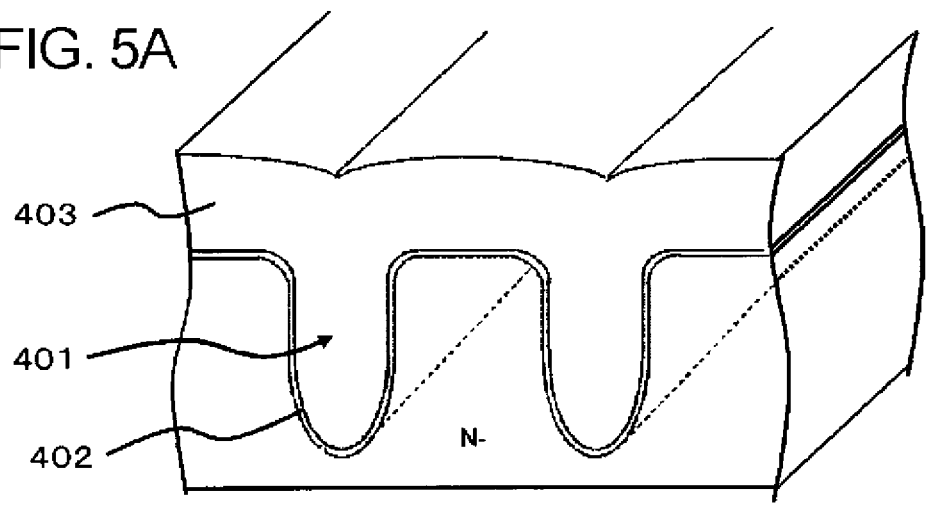
FIGS. 5A to 5C, and FIGS. 6A to 6C are sectional views schematically illustrating a manufacturing process of the MOSFET having buried insulating interlayers in gate trenches, according to an embodiment of the present invention.

In the first step, a stripe-patterned pair of trenches 401 are formed in a substrate, and a polysilicon layer 403 is formed over the entire surface so as to fill the trenches 401 (FIG. 5A).

The pair of trenches 401 are trenches formed in a stripe pattern in a silicon substrate.

The stripe-patterned pair of trenches 401 are formed almost in parallel with each other in the in-plane direction of the silicon substrate.

The polysilicon layer 403 is formed over the entire surface by an arbitrary growth process such as CVD (Chemical Vapor Deposition), PVD (Physical Vapor Deposition) or ALD (Atomic Layer Deposition). In this way, the polysilicon layer 403 is formed in the trench 401, and on the surface of the silicon substrate which corresponds to the predetermined region located between the pair of trenches 401.

A gate insulating film 402 may be formed between the surface of the silicon substrate and the polysilicon layer 403. The gate insulating film 402 is not specifically limited so far as it is excellent in the insulation resistance. In general, silicon oxide film, silicon nitride film and so forth may be adoptable.

[(ii) Second Step]

Figure 5B:
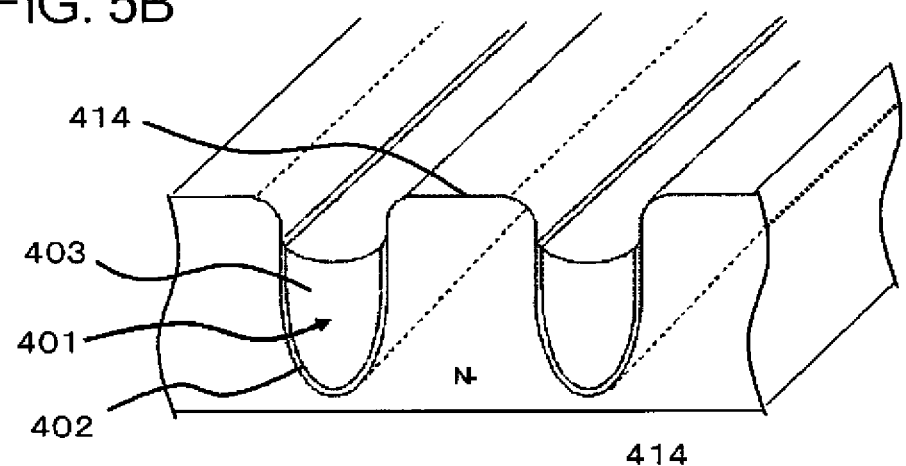

In the second step, the entire surface of the polysilicon layer 403 is etched back so far as to remove the upper portions thereof in the trenches 401, to thereby form exposed portions of the substrate to the side walls of the trenches 401 and to the top surface of the predetermined region, while leaving the residual polysilicon layers 403 which later serve as the buried gate electrodes (FIG. 5B).

By etching back the polysilicon layer 403 over the entire surface thereof, the top surface of the predetermined region located between the pair of trenches 401 may be exposed. The upper portions of the polysilicon layer 403 in the trenches 401 are removed by over-etching, to thereby expose the side wall portions of the trenches 401.

By etching back the entire surface of the polysilicon layer 403, the exposed portions 414 may be formed at the side walls of the trenches 401 and at the upper surface of the predetermined region located between the pair of trenches 401.

The exposed surface of the predetermined region shows the surficial portion of the silicon substrate, after removing therefrom the gate insulating film 402 and the polysilicon layer 403 previously formed on the silicon substrate in the first step.

As described later, in the third step and the fourth step, impurities are obliquely introduced by rotational implantation through the exposed portions 414 into the predetermined region of the silicon substrate, which is located between the pair of trenches 401.

[(iii) Third Step]

Figure 5C:
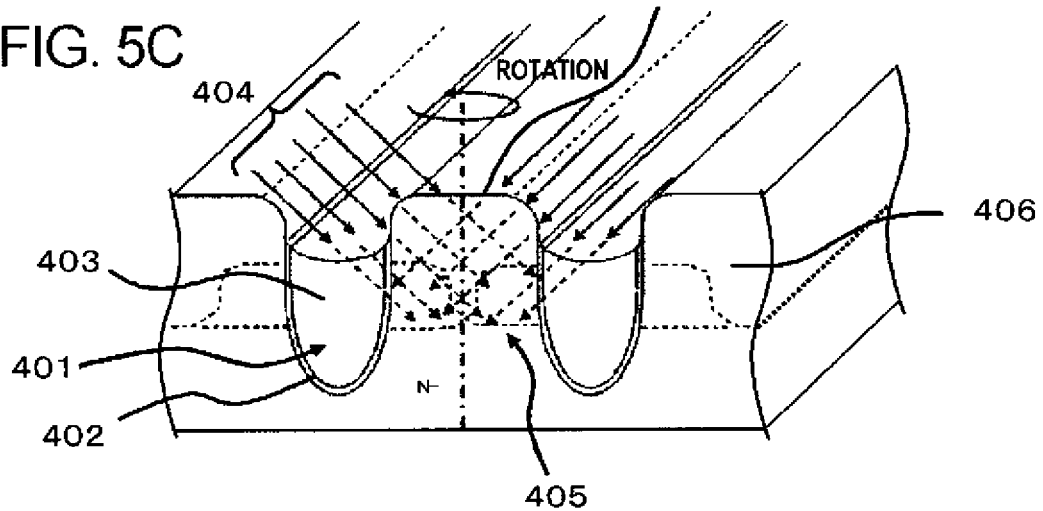
Figure 6A:
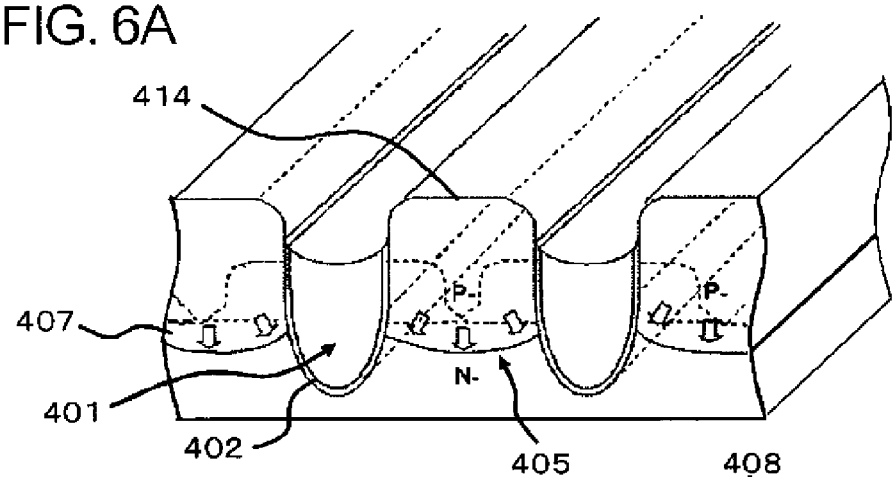

In the third step, a first impurity is obliquely implanted by the rotational implantation 404, which effects implantation in a direction inclined away from the direction of the normal line which stands on the substrate, through the exposed portions 414 into the predetermined region, the predetermined regions having the first impurity implanted therein is then heated so as to allow the first impurity to diffuse downward, to thereby form the base regions (P-base layers 407) (FIG. 5C, FIG. 6A).

First, the rotational implantation 404 will be explained referring FIG. 5C.

The rotational implantation 404 in the third step is conducted so as to obliquely introduce the first impurity in a direction inclined away from the direction of the normal line which stands on the silicon substrate, through the exposed portions 414 into the predetermined region.

The first impurity is obliquely introduced through both side faces, or a first and a second side faces, of the exposed portions 414.

The silicon substrate herein appears to expose the surficial portions thereof, after removal of the gate insulating film 402 and polysilicon layer 403 previously formed thereon, in the second step as described in the above.

Now in the rotational implantation 404, when the first impurity is implanted in the direction along which the path of flight overlaps the polysilicon layers 403, which later serve as the buried gate electrodes, and the gate insulating film 402, the first impurity hardly passes through the polysilicon layers 403, which later serve as the buried gate electrodes, and the gate insulating films 402. In other words, the polysilicon layers 403 and the gate insulating films 402 serve as a mask. Accordingly, the predetermined region of the silicon substrate will have regions which contain almost no first impurity implanted therein, in the vicinity of the polysilicon layers 403, which later serve as the buried gate electrodes, or the gate insulating films 402.

On the contrary, when the first impurity is implanted by the rotational implantation 404 in the direction along which the path of flight overlaps the exposed portions 414, rather than the polysilicon layers 403, which later serve as the buried gate electrodes, and the gate insulating films 402, the first impurity is implanted into the predetermined region.

In addition, the energy of the rotational implantation 404 in the third step may be set to a large value. By adjusting the energy of rotational implantation 404, the first impurity may obliquely be implanted through the exposed portion 414 so as to range from the surficial portion to the center portion of the predetermined region.

According to the strategy, since the first impurity may now be implanted through the exposed portion 414, particularly through the both side wall portions of the pair of trenches 401, up to a range beyond the center line of the predetermined region, so that the concentration of the first impurity at a center portion 405 may be elevated.

As described in the above, by making use of the exposed portions 414 formed in the second step, the ion implantation (rotational implantation 404) may be conducted in a self-aligned manner.

Since the center portion 405 having a high concentration of the first impurity may be formed by adjusting the angle of implantation, the P-base layer 406 may be formed so as to have a downwardly projected profile, as a result of the rotational implantation 404 in the third step.

The rotational implantation herein means a technique of implantation adopted when ion is implanted in a plurality of direction into the substrate, while rotating the silicon substrate around the center of the plane thereof, under setting of a certain angle of implantation (tilt angle).

In this embodiment, the center of the plane of the silicon substrate may be set at the center portion of the predetermined region located between a certain pair of trenches 401, as illustrated in FIG. 5C.

The rotational implantation includes a continuous process which allows implantation to proceed under continuous rotation, and a step-wise process which repeats a cycle including implantation while interrupting the rotation, and a predetermined angle of rotation while interrupting the implantation.

The first impurity may be a p-type impurity, and is exemplified by boron.

In the rotational implantation 404 in the third step, while assuming the distance between the pair of trenches 401 as D, the depth of implantation of the first impurity, measured in the direction normal to the normal line, out of average depths measured from the surface of the exposed portions 414 to a peak region of a concentration profile of the first impurity, may be adjusted to a level larger than D/2.

It is general in ion implantation that an impurity concentration profile is formed so as to have a peak at a predetermined depth as measured from the surface of the substrate. The distance from the surface of the substrate to the peak at a predetermined depth is defined as an average depth of impurity implantation.

Since the rotational implantation in this embodiment is conducted in an oblique direction inclined away from the direction of the normal line which stands on the silicon substrate, so that the average depth of impurity implantation is now considered in two ways, that is, the depth in the direction normal to the direction of the normal line, and the depth in the direction in parallel with the direction of the normal line.

Of the average depths of implantation of the first impurity, as measured from the surface of the exposed portion 414 to the peak region of the concentration profile of the first impurity, the depth of implantation in the direction normal to the direction of the normal line is determined.

Assuming now that the distance between the pair of trenches 401 as D, by adjusting the depth of implantation to a level larger than D/2, and the first impurity may be implanted through the exposed portions 414 on both sides of the pair of trenches 401 up to a range beyond the center line of the predetermined region. In this way, the peak region of the concentration profile of the first impurity is formed at the center portion 405.

Since the first impurity may be implanted through the exposed portions 414 on both sides of the pair of trenches 401 up to a range beyond the center line of the predetermined region as described in the above, the concentration of the first impurity may be elevated at the center portion 405.

Since the center portion 405 having a high concentration of the first impurity may be formed, so that the P-base layer 406 may be formed to have a downwardly projected profile as a result of the rotational implantation 404 in the third step.

The above-described depth of implantation may appropriately be determined, typically by adjusting the energy of rotational implantation depending on the distance D between the trenches 401.

In addition, the energy of rotational implantation 404 in the third step may be adjusted larger than the energy of rotational implantation 409 in the fourth step described later.

By elevating the energy of rotational implantation 404, the first impurity may be implanted more deeper into the predetermined region through the exposed portions 414 on both sides of the pair of trenches 401. Therefore, the concentration of the first impurity at the center portion 405 may further be elevated.

On the other hand, by reducing the energy of rotational implantation 409 than the energy of rotational implantation 404, the region to be implanted with the second impurity may be formed in the surficial portion of the predetermined region.

Since the center portion 405 having a high concentration of the first impurity is formed, so that the P-base layer 406 may be formed to have a downwardly projected profile as a result of the rotational implantation 404 in the third step.

The dose, energy, and angle of implantation of each of the rotational implantation 404, 409 may be determined depending on conditions relevant to design of the P-base layer 406 or an N$^+$-source layer 410 described later, and the distance between the trenches, based on confirmation by a simulation study.

Next, formation of a base region (P-base layer 407), by allowing the first impurity to diffuse downwardly under heating, will be explained referring to FIG. 6A.

The heating herein means a process of heating the predetermined region having the first impurity implanted therein, so as to allow the implanted first impurity to further diffuse into the predetermined region. The first impurity in the P-base layer 406 diffuses to form the P-base layer 407.

As described in the above, the center portion 405 of the P-base layer 406 may have a high concentration of the first impurity by the rotational implantation 404. Accordingly, if the condition of heating is appropriate, the center portion may be more deepened by diffusion, and thereby the P-base layer 407 may be formed to have a downwardly projected profile.

As described in the above, the first impurity is allowed to cause indentation diffusion downwardly from the top surface of the predetermined region under heating. By the indentation diffusion, the depth of diffusion of the first impurity may be adjustable.

The depth of diffusion herein may be assumed as the depth measured inwardly from the surface of the silicon substrate.

As described in the above, typically by the indentation diffusion, the center portion 405 of the P-base layer 407 may be thickened in the depth-wise direction of the silicon substrate.

In addition, the thickness of the center portion of the P-base layer 407 may be adjustable based on the geometry (convex, for example) of the P-base layer 406, the impurity concentration of the center portion 405 of the P-base layer 406, and conditions of heating (conditions of indentation) and so forth.

[(iiii) Fourth Step]

Figure 6B:
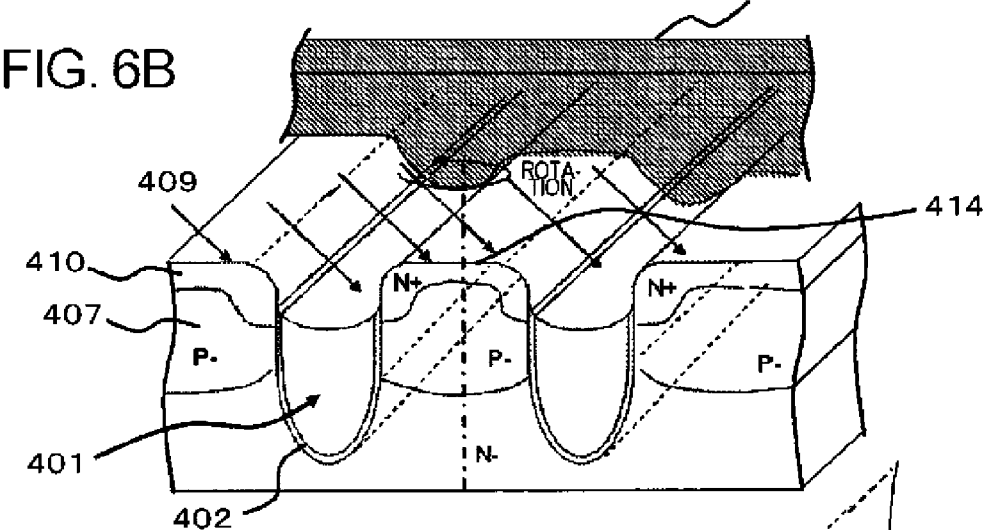

In the fourth step, a second impurity is obliquely implanted by the rotational implantation 409, through the exposed portions 414 into the predetermined region, to thereby form the source regions (W-source layers 410) over the base regions (P-base layers 407) (FIG. 6B).

As a result of diffusion of the first impurity inwardly from the surficial portion of the predetermined region in the third step, a region lowered in the concentration of the first impurity is formed in the surficial portion of the predetermined region.

Since the second impurity may be implanted into this region, the N$^+$-source layer 410 may be formed as described in the above, over the P-base layer 407 previously formed by thermal diffusion of the P-base layer 406.

The rotational implantation 409 will now be explained.

The energy of rotational implantation in the fourth step may be set to a low level.

By adjusting the energy of rotational implantation, a peak region of a concentration profile of the second impurity may be located in a region ranging from the surface of the exposed portions 414 only up to the surficial portion of the silicon substrate.

The second impurity is obliquely implanted through both side faces of the exposed portions 414, or a first and a second side faces. The second impurity is an n-type impurity, and is exemplified by antimony, arsenic, phosphorus and so forth.

In the rotational implantation 409 in the fourth step, assuming now that the distance between the pair of trenches 401 as D, out of average depths measured from the surface of the exposed portions 414 to a peak region of a concentration profile of the second impurity, the depth of implantation in the direction normal to the direction of the normal line may be adjusted to a level smaller than D/2.

As described in the above, a concentration profile of the second impurity having a peak at a predetermined depth from the surface of the substrate may be formed. The distance from the surface of the substrate to the peak at the predetermined depth is defined as an average depth of implantation of the second impurity. Since the rotational implantation in this embodiment is conducted in an oblique direction inclined away from the direction of the normal line which stands on the silicon substrate, so that the average depth of impurity implantation is now considered in two ways, that is, the depth in the direction normal to the direction of the normal line, and the depth in the direction in parallel with the direction of the normal line.

Of the average depths of implantation of the second impurity, as measured from the surface of the exposed portion 414 to the peak region of the concentration profile of the second impurity, the depth of implantation in the direction normal to the direction of the normal line is determined.

Assuming now that the distance between the pair of trenches 401 as D, and by adjusting the depth of implantation to a level smaller than D/2, a peak region of a concentration profile of the second impurity may be located in a region ranging from the surface of the exposed portions 414 only up to the surficial portion of the silicon substrate.

In this way, the N$^+$-source layer 410 having a backwardly recessed profile may be formed.

The depth of implantation may appropriately be determined typically by adjusting energy of rotational implantation, depending on the distance D between the trenches 401.

In addition, by setting the energy of rotational implantation in the fourth step smaller than the above-described energy of rotational implantation in the third step, the depth of implantation may be made shallower than that in the third step. Accordingly, the N+-source layer 410 having a backwardly recessed profile may be formed in the surficial portion of the silicon substrate.

The N+-source layer 410 may be heated at a temperature lower than that in the third step, so as to diffuse the second impurity. Accordingly, the N+-source layer 410 may be formed so as not to cause offset with respect to the buried gate electrode.

As described in the above, the second impurity may be allowed to cause indentation diffusion downwardly from the top surface of the predetermined region under heating. By the indentation diffusion, the depth of diffusion of the second impurity may be adjustable. The depth of diffusion herein may be assumed as the depth measured inwardly from the surface of the silicon substrate.

Moreover, if the condition of heating is appropriate, the second impurity may be allowed to cause indentation diffusion at low temperatures, so that the N+-source layer 410 may be formed to have a backwardly recessed profile, so as to fully avoid the offset with respect to the buried gate electrode.

While setting the angle of inclination away from the direction of the normal line in the third step almost equal to that in the fourth step, other conditions such as the energy of rotational implantation may be adjusted.

Alternatively, the angle of inclination away from the direction of the normal line in the third step may be set smaller than that in the fourth step, while leaving the energy of rotational implantation almost equal.

The impurity may be introduced more deeply into the silicon substrate from the surficial portion towards the inner portion, as the angle of implantation becomes smaller as described in the above, whereas the impurity may be introduced more shallowly in the surficial portion of the silicon substrate, as the angle of implantation becomes larger.

As described in the above, in the fourth step, the N+-source layer 410 may be formed so as to have the center portion thereof thinned in the depth-wise direction of the silicon substrate, while making the portions thereof on the buried gate electrode side thicker in the depth-wise direction of the silicon substrate. In this way, the thickness of the P-base layer 407 in the channel region, or the channel length, may be adjustable.

Moreover, the thickness of the portions of the N+-source layer 410 along the side walls of the buried gate electrodes may appropriately be set depending on the energy of rotational implantation 409, conditions of heating and so forth.

Figure 6C:
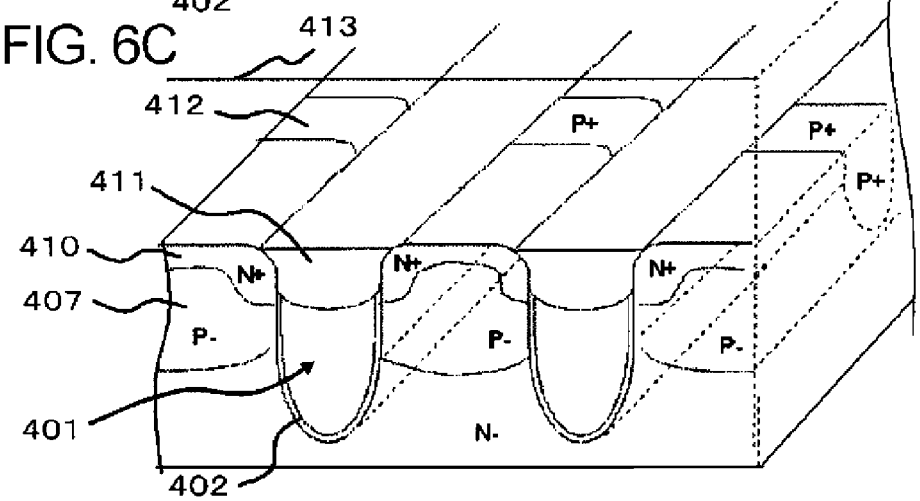

A step of forming buried insulating interlayers 411 and P+-back gate layers 412 will be explained below (FIG. 6C).

After the fourth step, the buried insulating interlayers 411 may be formed over the buried gate electrodes.

In the fourth step, regions reserved for later formation of the back gate layers (P+-back gate layers 412) over the P-base layer 407 are masked, the N+-source layers 410 are formed, the mask is then removed, and the P+-back gate layers 412 are then formed in the above-described reserved regions. Thereafter, a source electrode 413 is formed using aluminum, for example.

Figure 7:
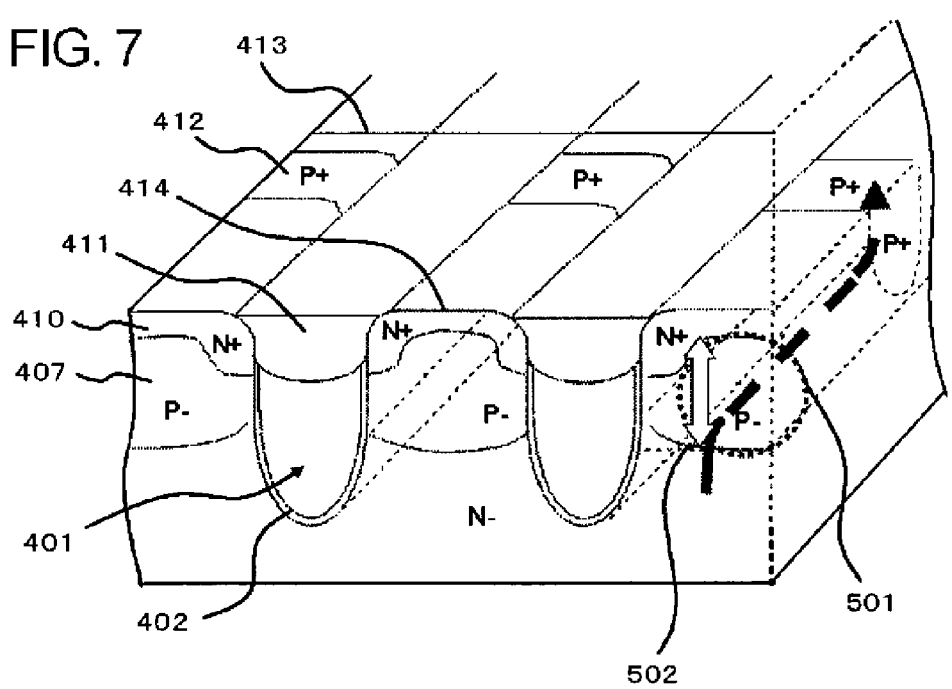
FIG. 7 is a drawing illustrating Avalanche operation in the MOSFET having buried insulating interlayers in gate trenches, according to an embodiment of the present invention.

Next, Avalanche operation of the MOSFET having the buried insulating interlayers in the gate trenches of this embodiment will be explained, referring to FIG. 7.

By virtue of the method of manufacturing according to this embodiment, the P-base layer may be formed to have a deep and downwardly projected profile, and the N+-source layer may be formed to have a thin and backwardly recessed profile. Accordingly, thickness 502 of the P-base layer which serves as an Avalanche current path 501 may be increased, and thereby the Avalanche resistance may be improved.

Effects of this embodiment will be explained.

The ion implantation (rotational implantations 404, 409) may be conducted in a self-aligned manner, using the exposed portions formed in the second step, and the P-base layer and the N+-source layer may be formed by this process. Accordingly, the N+-source layer may be prevented from causing offset with respect to the buried gate electrodes, and thereby the process of diffusion and indentation (heating) may be facilitated.

Since the thickness of the N+-source layer may be increased in the channel region, the ON resistance may be reduced. On the other hand, out of the channel region, since the P-base layer may be formed deeply from the surficial portion towards the inner portion of the silicon substrate in the direction of the normal line, and since the N+-source layer may be formed shallowly, the resistivity of the Avalanche current path may be reduced.

In short, the base layer may be made shallower and the source layer may be made deeper in the channel region, meanwhile the base layer may be made deeper and the source layer may be made shallower out of the channel region. Accordingly, the base resistance of the Avalanche current path may be reduced, and thereby the Avalanche resistance may be increased, while keeping the ON resistance at a low level.

In the publicly-known example (the U.S. Pat. No. 6,916, 712), the Avalanche resistance could not be improved, because both of the P-base layer and the N+-source layer which locate between a pair of trenches are formed so as to have almost constant thickness both in the channel region (both end regions in the vicinity of each gate trench) and in the non-channel region (center portion away from the gate trenches). In contrast, according to the embodiment of the present invention, in the non-channel region (center portion away from the gate trenches) located between the pair of trenches, the P-base layer is formed to have a downwardly projected profile, and the N+-source layer is formed to have a backwardly recessed profile so as to ensure the Avalanche current path, so that the Avalanche resistance may be improved.

Figure 8A:
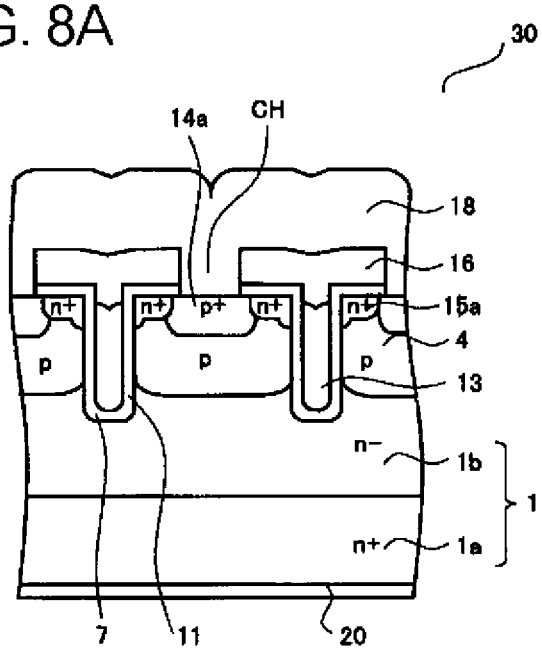
FIGS. 8A and 8B are sectional views schematically illustrating a structure of a MOSFET of the related art.
Figure 8B:
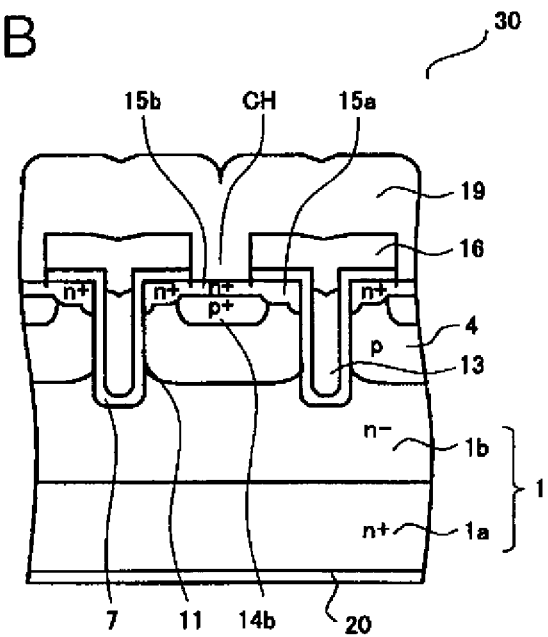

According to the method of manufacturing disclosed in Japanese Laid-Open Patent Publication No. 2008-112936 described in the above, a first back gate region 14a and a second back gate region 14b are formed by introducing a p-type impurity by ion implantation, over the entire surface while using an insulating interlayer 16 as a mask (FIGS. 8A and 8B).

For this reason, it was necessary to form the insulating interlayer 16 not only in the trenches, but also outside the trenches so as to swell beyond the edges thereof. This configuration was suffering from a problem in that the pitch of every adjacent trench gates cannot be narrowed, corresponding to the degree of swelling of the insulating interlayer 16 outwardly from the trenches.

In contrast, in this embodiment, the P-base layer 407 and the N+-source layer 410 are formed by the ion implantations (rotational implantations 404, 409) in a self-aligned manner using the above-described exposed portions 414 formed in the second step. Since the buried insulating interlayers 411 are not used as a mask, the buried insulating interlayers 411 may be buried in the trenches 401. Accordingly, the pitch of the trench gates may be narrowed.

A MOSFET having buried insulating interlayers in the gate trenches of this embodiment will be explained, referring to FIG. 1.

A semiconductor device in one embodiment of the present invention has buried gate electrodes 103 formed in a pair of trenches formed in a silicon substrate (an n⁻-epitaxial layer 108, and an n⁺⁺-substrate 109).

The semiconductor device has still also a base region (P-base layer 105) formed in a predetermined region located between a stripe-patterned pair of trenches; a source region (N⁺-source layer 106) formed over the P-base layer 105; a first region having a first PN junction plane between the P-base layer 105 and the N⁺-source layer 106 in a channel region in the predetermined region located between the pair of trenches, and a second PN junction plane between the P-base layer 105 and the N⁺-source layer 106, formed shallower than the first PN junction plane in a non-channel region; and a second region having a base region (P-base layer) formed in the predetermined region, wherein the first region and the are alternately arranged in the longitudinal direction of the pair of trenches. It is defined herein that the region having the N⁺-source layer 106 deepened therein (both end regions in the vicinity of each gate trench) is denoted as a channel region, and the region having the N⁺-source layer 106 shallowed therein (center portion away from the gate trenches) is denoted as a non-channel region.

The semiconductor device of this embodiment has the PN junction planes where the P-base layer 105 and the N⁺-source layer 106 are brought into contact. Of the PN junction planes, each of those formed in the channel region is denoted as the first PN junction plane, and each of those formed in the non-channel region is denoted as the second PN junction plane.

As illustrated in FIG. 1, the second PN junction plane is formed shallower than the first PN junction plane when viewed in the depth-wise direction of the substrate. Accordingly, the base layers are formed shallower and the source layers are formed deeper in the channel region, meanwhile the base layers are formed deeper and the source layers are formed shallower outside the channel region.

As a consequence, the base resistance of the Avalanche current path may be reduced, and thereby the Avalanche resistance may be increased, while keeping the ON resistance at a low level.

In this embodiment, the first regions and the second regions are alternately arranged in the longitudinal direction of the stripe-patterned pair of trenches. The first regions and the second regions are arranged preferably in an alternately continuous manner, but not limited thereto. At least, it is good enough if the second regions are not arranged adjacent to each other.

The length of the first regions and the second regions in the longitudinal direction of the trenches may be adjusted by the above-described rotational implantation. In this way, the length of the first regions in the longitudinal direction of the trenches may be determined depending on the arrangement of the first regions and the second regions, and by the rotational implantation.

The ON resistance and Avalanche resistance of the semiconductor device of this embodiment may be adjustable by setting the length of the first region in the longitudinal direction of the trenches.

In addition, a buried insulating interlayer 101 is formed over each buried gate electrode 103. A gate insulating film 104 is formed on the inner wall portion of each trench, and also a source electrode 102 and a drain electrode 110 are formed (FIG. 1).

In the second region, a back gate layer (P⁺-back gate layer 107) is formed in the upper portion of the P-base layer. The base region (P-base layer 105) may contain a first impurity, and the source region (N⁺-source layer 106) may contain a second impurity. The first impurity and the second impurity may be those described in the above.

By the way, as illustrated by the sectional view illustrated in FIG. 8A, the semiconductor device disclosed by the above-described Japanese Laid-Open Patent Publication No. 2008-112936 has first source regions 15a in the surficial portion of the channel regions 4 located adjacent to the trenches 7. In addition, as illustrated by the sectional view illustrated in FIG. 8B, the second source regions 15b are extended in a second direction orthogonal to the first source regions 15a, and provided so as to interconnect two first source regions 15a disposed on both sides of each back gate region 14b.

For this reason, it has been necessary to form the second source regions 15b so as to extend in the second direction orthogonal to the first source regions 15a. The configuration has, however, been suffering from a problem in that the resistance of the Avalanche current path could not fully be reduced, and thereby the Avalanche resistance was insufficient as a whole, due to presence of the first source regions 15a.

In contrast in this embodiment, the first regions in need of a certain level of Avalanche resistance and the second regions in no need of Avalanche resistance are alternately arranged in the longitudinal direction of the stripe-patterned pair of trenches. In addition, as described in the above, the first regions may be improved in the Avalanche resistance, while keeping the ON resistance at a low level. Since a structure capable of improving the Avalanche resistance is formed in the first region in need of a certain level of Avalanche resistance, while keeping the ON resistance at a low level as described in the above, the semiconductor device of this embodiment successfully obtains a sufficient level of Avalanche resistance as a whole.

The embodiment of the present invention is adoptable also to those having a short pitch of gate trenches, out of vertical MOSFETs having buried insulating interlayers in the gate trenches.

EXAMPLES

Next, specific examples of this embodiment will be explained.

First, the gate oxide film was formed in the trenches, and the polysilicon layer was grown thereon, so as to fill the trenches. Next, the polysilicon layer filled in the trenches was etched back.

Rotational implantation for forming the base regions was then carried out in a self-aligned manner making use of the exposed side walls of the trenches, and the top surface of the predetermined region located between the pair of trenches.

The energy of implantation in this process was set so that the impurity may be introduced deeply enough relative to the distance between the adjacent trenches. In this case, the impurity concentration was elevated at the center portion of the predetermined region, by virtue of the impurity implanted from both sides of the adjacent trenches.

Conditions of the rotational implantation typically for forming the base regions are as follow:

trench-to-trench distance: 0.5 μm;
impurity: boron;
acceleration voltage: 100 key or larger and 120 key or smaller;
dose: approximately $1E12/cm^2$ or more and $1E13/cm^2$ or smaller; and
angle of rotational implantation: 40° or larger and 50° or smaller.

The conditions in the above were confirmed by a simulation study.

The conditions may appropriately be varied depending on design of the diffusion layers, pitch of the trenches and so forth.

After the implantation for forming the base regions, the base layers were formed by indentation. The center of each region subjected to rotational implantation was found to have an elevated impurity concentration. Under appropriate conditions for indentation, the impurity in the center portion was allowed to diffuse more deeply, and thereby the P-base layers were formed to have a downwardly projected profile.

Conditions of the indentation were set as follow:

temperature: 950° C. or higher and 1000° C. or lower; and time: 30 min or longer, and 60 min or shorter.

It was confirmed that the P-base layers having a downwardly projected profile were formed by the indentation under the above-described conditions.

After the P-base layers were formed, the $N^+$-source layers were formed by rotational implantation, while masking the regions reserved for formation of the back gate with a photoresist.

Conditions of the rotational implantation for forming the base layers were set as follow:

impurity: arsenic;

acceleration energy: 30 keV; and angle of rotational implantation: 40° or larger and 50° or smaller.

The implantation for forming the source layers were carried out at a low energy, so as to introduce the impurity into the predetermined region along the side walls of the gate trenches and in the surficial region of the silicon substrate, and thereby the $N^+$-source layers were formed to have a backwardly-recessed profile in the predetermined region at a correspondent depth.

Accordingly, the $N^+$-source layers were formed without causing offset with respect to the polysilicon layers which serve as the buried gate electrodes, sufficiently at a low temperature of indentation (800° C. or higher, and 850° C. or lower).

Thereafter, the insulating interlayer filling up the trenches, and the $P^+$-back gate layers were formed. The source electrode and the drain electrode were formed typically by using aluminum. The semiconductor device of this embodiment was thus manufactured.

The base layers are formed shallower and the source layers are formed deeper in the channel region, meanwhile the base layers are formed deeper and the source layers are formed shallower outside the channel region.

As a consequence, the base resistance of the Avalanche current path was successfully reduced, and thereby the Avalanche resistance was increased, while keeping the ON resistance at a low level.

Of course, the above-described embodiment and a plurality of modified examples may arbitrarily be combined so far as they do not cause contradiction thereamong. Structures of the individual components in the above-described embodiment and modified examples specifically explained in the above may be modified in various ways, so far as the objects of the present invention may be satisfied.

It is apparent that the present invention is not limited to the above embodiments, that may be modified and changed without departing from the scope and spirit of the invention.

What is claimed is:

1. A semiconductor device comprising:
a semiconductor layer; and
first and second striped-patterned trenches formed in the semiconductor layer, the first and second striped-patterned trenches extending in a first direction in parallel with each other,
wherein each of the first and second striped-patterned trenches comprises:
a gate electrode housed in the striped-patterned trench with a gate insulating film intervening between the gate electrode and the semiconductor layer, a top face of the gate electrode being lower than a top face of the semiconductor layer; and
a buried insulating inter layer covering the gate electrode and housed in the striped-patterned trench,
wherein the semiconductor layer comprises:
a drain region of a first conductive type, each bottom part of the first and second striped-patterned trenches being formed in an upper part of the drain region;
a base region of a second conductive type formed on the drain region and between the first and second striped-patterned trenches, a bottom face of the base region having a downwardly curved profile; and
a source region of the first conductive type formed on the base region and between the first and second striped-patterned trenches, the source region having a substantially uniform thickness in a second direction from the first striped-patterned trench to the second striped-patterned trench, and
wherein a thickness of the base region at a center between the first and second striped-patterned trenches is thicker than that of each edge portion of the base region adjacent to the first and second striped-patterned trenches.

2. The semiconductor device of claim 1, wherein the semiconductor layer further comprises:
a back gate region of the second conductive type formed in the base region and between the first and second striped-patterned trenches so that the back gate region is adjacent to the source region in the first direction, an impurity concentration of the back gate region being higher than that of the base region.

3. The semiconductor device of claim 2, wherein a top face of the buried insulating interlayer is lower than the top face of the semiconductor layer which includes a top face of the source region and top face of the back gate region.

4. The semiconductor device of claim 3, further comprising:
a source electrode formed on the top face of the buried insulating interlayer, the top face of the source region and the top face of the back gate region; and
a drain electrode formed on a back face of the semiconductor layer.

5. The semiconductor device of claim 4, wherein the drain region comprises a lower layer and an upper layer, an impurity concentration of the lower layer being higher than that of the upper layer, and the back face of the semiconductor layer on which the drain electrode is formed corresponds to a back face of the lower layer.

6. The semiconductor device of claim 1, wherein the bottom face of the base region interfaces with the drain region.

7. The semiconductor device of claim 1, wherein the source region has a thickness in the first direction at edge portions of the source region adjacent to the first and second striped-patterned trenches greater than a thickness of the source region between the edge portions of the source region.

* * * * *